United States Patent
Dobbs et al.

(10) Patent No.: US 6,896,539 B2
(45) Date of Patent: May 24, 2005

(54) PIVOT COMPONENT COUPLED WITH FIRST CIRCUIT BOARD FOR CONTROL OF RELATIVE ALIGNMENT OF FIRST CIRCUIT BOARD CONNECTION COMPONENT WITH SECOND CIRCUIT BOARD CONNECTION COMPONENT

(75) Inventors: Robert William Dobbs, Granite Bay, CA (US); Andrew Harvey Barr, Roseville, CA (US); Stephan Karl Barsun, Davis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 25 days.

(21) Appl. No.: 10/610,144

(22) Filed: Jun. 30, 2003

(65) Prior Publication Data

US 2004/0266249 A1 Dec. 30, 2004

(51) Int. Cl.[7] ............................................... H01R 13/64
(52) U.S. Cl. ..................... 439/376; 439/341; 361/802
(58) Field of Search ........................... 439/376, 65, 44, 439/341; 361/789, 755, 801, 802, 790, 326

(56) References Cited

U.S. PATENT DOCUMENTS

| | | | |
|---|---|---|---|
| 4,501,458 A | | 2/1985 | Cubbage |
| 5,253,140 A | * | 10/1993 | Inoue et al. ................ 361/728 |
| 5,268,820 A | * | 12/1993 | Tseng et al. ................ 361/785 |
| 5,273,462 A | * | 12/1993 | Huser et al. ................ 439/681 |
| 5,302,136 A | * | 4/1994 | St. Germain et al. ....... 439/376 |
| 5,325,269 A | * | 6/1994 | Someno ...................... 361/796 |
| 5,378,169 A | * | 1/1995 | Volz et al. .................. 439/376 |
| 5,476,392 A | * | 12/1995 | Inaba et al. ................. 439/376 |
| 5,486,982 A | * | 1/1996 | Hsu ............................ 361/728 |
| 5,642,263 A | | 6/1997 | Lauruhn |
| 5,666,264 A | * | 9/1997 | Chandler et al. ........... 361/683 |
| 5,697,802 A | * | 12/1997 | Kawabe ...................... 439/326 |
| 5,860,828 A | | 1/1999 | Anderson et al. |
| 5,973,918 A | * | 10/1999 | Felcman et al. ............ 361/683 |
| 6,048,221 A | * | 4/2000 | McCleerey et al. ......... 439/326 |
| 6,065,989 A | * | 5/2000 | Walkup et al. .............. 439/341 |
| 6,083,027 A | * | 7/2000 | Sato ............................ 439/341 |
| 6,093,042 A | * | 7/2000 | Lemke et al. ............... 439/341 |
| 6,155,860 A | * | 12/2000 | Lemke et al. ............... 439/341 |
| 6,174,188 B1 | | 1/2001 | Martucci |
| 6,217,360 B1 | * | 4/2001 | Parent ........................ 439/341 |
| 6,234,820 B1 | * | 5/2001 | Perino et al. ............... 439/326 |
| 6,273,744 B1 | * | 8/2001 | Murdock et al. ........... 439/374 |
| 6,282,099 B1 | | 8/2001 | Wilson et al. |
| 6,332,795 B1 | * | 12/2001 | Conorich ..................... 439/188 |
| 6,350,141 B1 | * | 2/2002 | Houtz ......................... 439/341 |
| 6,357,603 B1 | | 3/2002 | Dingman |
| 6,358,080 B1 | * | 3/2002 | Conorich ..................... 439/341 |
| 6,361,336 B1 | * | 3/2002 | Zhao et al. .................. 439/157 |
| 6,406,316 B1 | * | 6/2002 | Lemke et al. ............... 439/341 |
| 6,439,911 B1 | * | 8/2002 | Conorich ..................... 439/341 |
| 6,461,196 B2 | | 10/2002 | Wilson et al. |
| 6,497,580 B2 | | 12/2002 | Watanabe et al. |
| 6,510,056 B1 | | 1/2003 | Kusyk et al. |
| 6,524,114 B2 | | 2/2003 | Watanabe et al. |
| 6,570,775 B2 | * | 5/2003 | Lai ............................. 361/801 |
| 6,629,849 B2 | * | 10/2003 | Yu .............................. 439/74 |
| 2003/0227761 A1 | * | 12/2003 | Liao et al. .................. 361/801 |

* cited by examiner

*Primary Examiner*—Ross Gushi

(57) ABSTRACT

A pivot component of an apparatus in one example is coupled with a first circuit board that comprises a first connection component. The pivot component controls a relative alignment of the first connection component with a second connection component of a second circuit board for an engagement of the first connection component with the second connection component.

45 Claims, 2 Drawing Sheets

PIVOT COMPONENT COUPLED WITH FIRST CIRCUIT BOARD FOR CONTROL OF RELATIVE ALIGNMENT OF FIRST CIRCUIT BOARD CONNECTION COMPONENT WITH SECOND CIRCUIT BOARD CONNECTION COMPONENT

BACKGROUND

A circuit board connector in one example couples a first circuit board with a second circuit board. For example, the circuit board connector comprises a parallel board-to-board connector. The circuit board connector electrically and mechanically connects the first circuit board with the second circuit board. In one example, the circuit board connector holds the first circuit board in parallel with the second circuit board. In another example, the circuit board connector transfers electrical signals between the first circuit board and the second circuit board. The circuit board connector in one example comprises a first connection component and a second connection component. The first connection component is attached to the first circuit board and the second connection component is attached to the second circuit board. The first connection component and the second connection component engage to couple the first circuit board with the second circuit board.

The first connection component comprises one or more pins and the second connection component comprises one or more sockets to receive the one or more pins. In one example, the pins of the first connection component are manually pressed into the sockets of the second connection component to engage the first connection component with the second connection component. To disengage the first connection component from the second connection component, the pins of the first connection component are manually pulled from the sockets of the second connection component. In another example, a jacking screw provides a force to engage and/or disengage the pins of the first connection component and the sockets of the second connection component.

For engagement of the first connection component with the second connection component, an insertion angle of the pins of the first connection component into the sockets of the second connection component should be within a threshold range of insertion angles. If the insertion angle is outside the threshold range, then damage may occur to the first connection component and/or the second connection component. As one shortcoming, the manual press fit and the jacking screw engagement of the pins and sockets may fail to keep the insertion angle within the threshold range.

DESCRIPTION OF THE DRAWINGS

Features of exemplary implementations of the invention will become apparent from the description, the claims, and the accompanying drawings in which:

DETAILED DESCRIPTION

Figure 1:
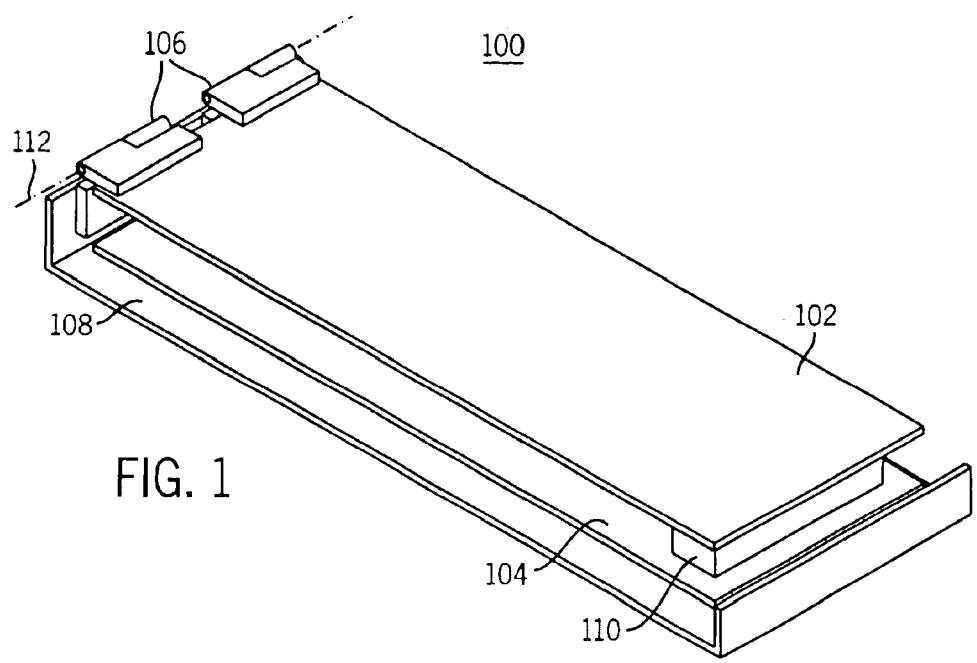
FIG. 1 is a representation of an exemplary implementation of an apparatus that comprises one or more circuit boards, one or more pivot components, and a chassis.

Turning to FIG. 1, an apparatus 100 in one example comprises a plurality of components such as hardware components. A number of such components can be combined or divided in one example of the apparatus 100. The apparatus 100 in one example comprises any (e.g., horizontal, oblique, or vertical) orientation, with the description and figures herein illustrating one exemplary orientation of the apparatus 100, for explanatory purposes.

The apparatus 100 in one example comprises one or more circuit boards 102 and 104, one or more pivot components 106, and a chassis 108. The chassis 108 comprises a frame to house the circuit boards 102 and 104 and the pivot component 106. One or more standoffs in one example attach the circuit board 104 with the chassis 108. The chassis 108 in one example comprises a computer case. The circuit boards 102 and 104 comprise one or more connection components. For example the circuit board 102 comprises a connection component 302 (FIG. 3) and the circuit board 104 comprises a connection component 10.

Figure 3:
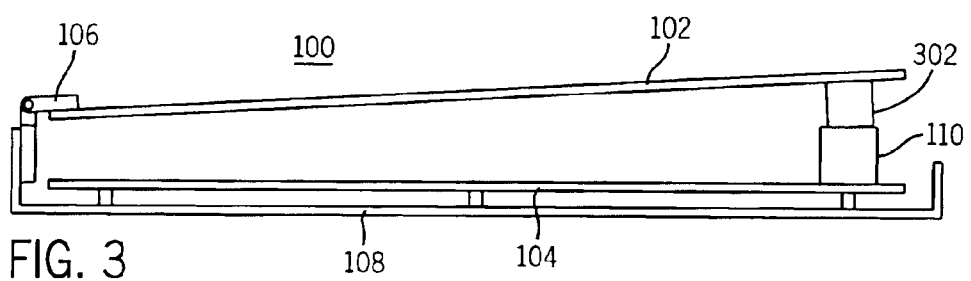
FIG. 3 is a representation of a first circuit board decoupled from a second circuit board of the one or more circuit boards of the apparatus of FIG. 1.

Referring to FIGS. 1 and 3, the connection component 302 engages with the connection component 110 to couple the circuit board 102 with the circuit board 104. In one example, the connection components 110 and 302 comprise electrical connectors. One or more electrical signals pass between the circuit board 102 and the circuit board 104 through the connection component 10 and the connection component 302. In another example, the connection components 110 and 302 comprise power distribution connectors. Power is distributed between the circuit board 102 and the circuit board 104 through the connection component 110 and the connection component 302. In another example, the connection components 110 and 302 comprise parallel board-to-board connectors. Upon engagement of the connection component 302 with the connection component 10, the connection components 110 and 302 hold the circuit board 102 substantially in parallel with the circuit board 104.

To engage the connection component 302 with the connection component 110, a portion of the connection component 302 is inserted into a portion of the connection component 110. For example, the connection component 302 comprises a mating relationship with the connection component 110. The engagement of the connection component 302 with the connection component 10 comprises a mating length. The mating length comprises a distance spanned from an initial contact between the connection component 302 and the connection component 110 to a full establishment of the engagement of the connection component 302 and the connection component 110. The engagement of the connection component 302 with the connection component 110 comprises a mating angle.

In one example, the mating angle comprises an insertion angle. The mating angle and/or the insertion angle of the engagement in one example comprises a misalignment angle between the connection component 302 and the connection component 110. The misalignment angle in one example comprises a deviation from an ideal mating angle. In another example, the mating angle comprises an extraction angle. To disengage the connection component 302 from the connection component 110, a portion of the connection component 302 is extracted from a portion of the connection component 110.

A first one of the connection components 110 and 302 comprises one or more pins and a second one of the connection components 110 and 302 comprises one or more sockets to receive the one or more pins. For example, the connection component 302 comprises the pins and the connection component 110 comprises the sockets. To engage the connection component 302 with the connection component 110, the pins of the connection component 302 are inserted into the sockets of the connection component 10. The connection components 110 and 302 in one example comprise matched impedance connectors, for example MICTOR™ connectors offered by Tyco International Ltd. (Pembroke HM 08, Bermuda, http://www.tyco.com).

In one example, the pivot component 106 is connected with the circuit board 102. For example, one or more connectors attach the pivot component 106 with the circuit board 102. In another example, the pivot component 106 is a part of the circuit board 102. For example, the pivot component 106 and the circuit board 102 comprise a unitary construction and/or integral formation.

The pivot component 106 controls a relative alignment of the connection component 302 with the connection component 110 for the engagement of the connection component 302 with the connection component 110. The pivot component 106 in one example comprises a hinge, pin, lock, hub, axle, fulcrum, shaft, spindle, swivel and/or parts with interlocking details. In one example, the pivot component 106 is coupled with the circuit board 102. In one example, the pivot component 106 is coupled with the circuit board 102. In a further example, the pivot component 106 is coupled with the circuit board 102 and the chassis 108. In another example, the pivot component 106 is coupled with the circuit board 102 and the circuit board 104.

The pivot component 106 allows a rotational movement of the circuit board 102 about an axis 112. The pivot component 106 pivotably supports the circuit board 102. For example, the pivot component 106 guides a movement of the circuit board 102 about the pivot component 106 to selectively couple the connection component 302 with the connection component 110. In one example, the circuit board 102 is movable about the pivot component 106 to selectively couple the connection component 302 with the connection component 110. In another example, the circuit board 102 is movable about the pivot component 106 to selectively decouple the connection component 302 from the connection component 110.

The pivot component 106 in one example attaches a first end portion of the circuit board 102 to the chassis 108. The second end portion of the circuit board 102 extends out away from the pivot component 106. Movement of the circuit board 102 rotates the second end portion of the circuit board 102 about the axis 112. The connection component 302 in one example is located on the second end portion of the circuit board 102.

The circuit board 102 comprises a first major face and a second major face. The first and second major faces comprise surfaces for one or more of electrical components and connection components (e.g., the connection component 302). The circuit board 102 is movable about the axis 112 to provide access to both the first major face and the second major face without detachment of the circuit board 102 from the chassis 108. For example, the circuit board 102 is movable about the pivot component 106 to promote an ease in access to the circuit board 102 within the chassis 108.

The pivot component 106 supports the weight of the circuit board 102. For example, the pivot component 106 supports the weight of the circuit board 102 to aid in installation and servicing of the circuit board 102. The pivot component 106 promotes a tool-less installation and servicing of the circuit board 102. The pivot component 106 may hold a position of the circuit board 102 steady until a user adjusts the position of the circuit board 102. The pivot component 106 in one example comprises a tightening screw. Upon tightening the screw in the pivot component 106, the screw inhibits the circuit board 102 from rotational movement about the pivot component 106.

The pivot component 106 in one example comprises a rotation restraint component. The rotation restraint component limits a speed of a rotational movement of the circuit board 102 about the axis 112. For example, the rotation restraint component slows the rotational movement of the circuit board 102 about the axis 112. The rotation restraint component promotes an increase in a resistance to the rotational movement of the circuit board 102. The rotation restraint component in one example comprises a spring-loaded component.

In one example, the circuit board 102 experiences a rotational movement. The rotational movement leads to contact between the connection component 302 and the connection component 110. The rotational movement in one example comprises an accidental rotational movement of the circuit board 102. The rotation restraint component slows the speed of the rotational movement to limit the speed of the connection component 302 at the point of contact with the connection component 110. The rotation restraint component promotes a decrease in a likelihood of damage to one or more of the connection components 302 and 110.

Upon an initial contact between the connection component 302 and the connection component 110 for the engagement of the connection component 302 with the connection component 110, the pivot component 106 limits a misalignment between the connection component 302 and the connection component 110. For example, the pivot component 106 limits the misalignment angle of the engagement of the connection component 302 with the connection component 110. The misalignment angle is limited based on the position of the pivot component 106 relative to an engagement location of the connection component 302 with the connection component 110.

The pivot component 106 is separated from the connection component 302 by a distance on the circuit board 102. The distance is set to limit the misalignment angle to be within a user-selected acceptable range upon the engagement of the connection component 302 with the connection component 110. The user-selected acceptable range of the misalignment angle comprises a threshold value, for example, a largest misalignment angle in the user-selected acceptable range. The pivot component 106 keeps the misalignment angle below the threshold value. The user-selected acceptable range of the misalignment angle is based on tolerances of the engagement between the connection component 302 with the connection component 110. For example, the user-selected acceptable range of the misalignment angle is chosen to prevent damage to the connection component 302 and the connection component 110 upon the engagement of the connection component 302 with the connection component 110.

The pivot component 106 controls the relative alignment of the connection component 302 with the connection component 110 to be within the user-selected acceptable range of the misalignment angle to prevent damage to the connection component 302 and the connection component 110. In one example, the pivot component 106 controls the relative alignment to prevent damage to the pins of the connection component 302 and the sockets of the connection component 110. In another example, the pivot component 106 promotes a decrease in a likelihood of damage to a connection between the connection component 302 and the circuit board 102. In yet another example, the pivot component 106 promotes a decrease in a likelihood of damage to a connection between the connection component 110 and the circuit board 104.

In one example, the distance that separates the pivot component 106 and the connection component 302 is based on the user-selected acceptable range of misalignment angles. In another example, the distance that separates the pivot component 106 and the connection component 302 is based on the user-selected acceptable range of misalignment angles and the mating length of the engagement.

In a further example, the distance that separates the pivot component 106 and the connection component 302 is substantially equal to the mating length of the engagement divided by a result of a tangent function applied to the largest misalignment angle in the user-selected acceptable range of misalignment angles. In one example, the mating length of the engagement is 0.61 centimeters (0.24 inches) and the largest misalignment angle in the user-selected acceptable range of misalignment angles is 1.5 degrees. The pivot component 106 in one example is located at a distance from the circuit board 104 so that upon the engagement of the connection component 302 with the connection component 110, the circuit board 102 is substantially parallel with the circuit board 104. Therefore, to limit the misalignment angle to 1.5 degrees or less, the distance between the pivot component 106 and the connection component 302 is set at or above 0.61/tan 1.5=23.29 centimeters (9.20 inches).

In yet another example, the distance between the pivot component 106 and the circuit board 104 may be increased so that the distance between the pivot component 106 and the connection component 302 may be reduced. The distance between the pivot component 106 and the circuit board 104 is increased to a point where upon the engagement of the connection component 302 with the connection component 110, the circuit board 102 is slightly out-of-parallel with the circuit board 104. Therefore, the distance between the pivot component 106 and the connection component 302 may be reduced from 23.29 centimeters (9.20 inches), as derived above.

In one example, if the distance between the pivot component 106 and the circuit board 104 is increased by 0.15 centimeters (0.06 inches) and the circuit boards 102 and 104 are allowed to be 0.5 degrees out-of-parallel, then the distance between the pivot component 106 and the connection component 302 may be reduced from 23.29 centimeters (9.20 inches) to 17.53 centimeters (6.90 inches). In another example, if the distance between the pivot component 106 and the circuit board 104 is increased by 0.20 centimeters (0.08 inches) and the circuit boards 102 and 104 are allowed to be 0.75 degrees out-of-parallel, then the distance between the pivot component 106 and the connection component 302 may be reduced from 23.29 centimeters (9.20 inches) to 15.49 centimeters (6.10 inches). In yet another example, if the distance between the pivot component 106 and the circuit board 104 is increased by 0.30 centimeters (0.12 inches) and the circuit boards 102 and 104 are allowed to be 1.5 degrees out-of-parallel, then the distance between the pivot component 106 and the connection component 302 may be reduced from 23.29 centimeters (9.20 inches) to 11.68 centimeters (4.60 inches).

In one example, the circuit board 102 comprises a printed circuit board ("PCB") with a length at least as long as the distance of separation between the connection component 302 and the pivot component 106 to achieve the user-selected acceptable range of misalignment angles. For example, a first end portion of the printed circuit board is coupled with the pivot component 106 and a second end portion of the printed circuit board holds the connection component 302. In another example, the circuit board 102 comprises a printed circuit board with a length shorter than the distance of separation between the connection component 302 and the pivot component 106 to achieve the user-selected acceptable range of misalignment angles. The printed circuit board is coupled with a board length extender to make the circuit board 102 at least as long as the distance of separation between the connection component 302 and the pivot component 106 to achieve the user-selected acceptable range of misalignment angles. The board extender is coupled with the pivot component. The board extender in one example comprises sheet metal.

Figure 2:
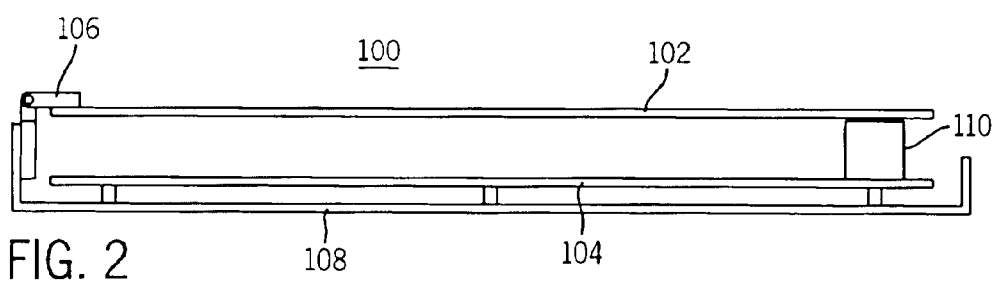
FIG. 2 is a representation of a first circuit board coupled with a second circuit board of the one or more circuit boards of the apparatus of FIG. 1.

Turning to FIG. 2, in one exemplary arrangement of the apparatus 100 the circuit board 102 is coupled with the circuit board 104. For example, the connection component 302 (FIG. 3) is engaged with the connection component 110. Referring to FIG. 3, in another exemplary arrangement of the apparatus 100 the circuit board 102 is decoupled from the circuit board 104. For example, the connection component 302 is disengaged from the connection component 110.

Figure 4:
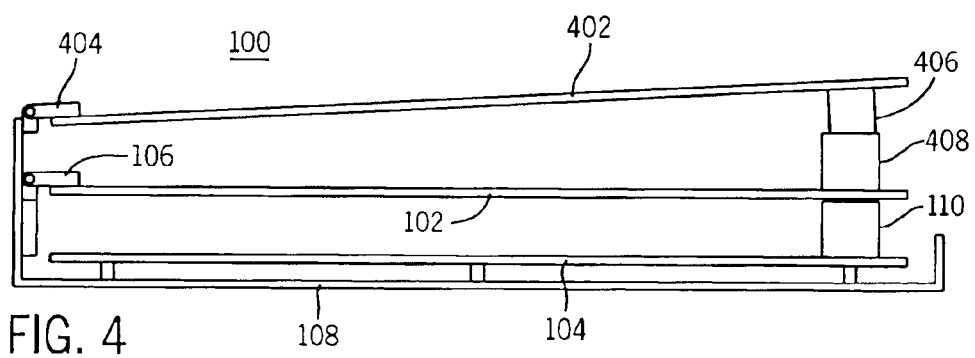
FIG. 4 is a representation of another exemplary implementation of the apparatus of FIG. 1 that comprises a plurality of pivot components that selectively couple a plurality of circuit boards.

Turning to FIG. 4, in one exemplary implementation of the apparatus 100 a plurality of pivot components may selectively couple a plurality of circuit boards. For example, the apparatus 100 comprises a circuit board 402, a pivot component 404, the circuit boards 102 and 104, the pivot component 106, and the chassis 108. The pivot component 106 selectively couples the circuit board 102 with the circuit board 104, as described herein. The pivot component 404 selectively couples the circuit board 402 with the circuit board 102, analogously to the selective coupling of the circuit board 102 with the circuit board 104. In one example, the apparatus 100 comprises the pivot components 106 and 404 that pivotably support the circuit boards 102 and 402. In another example, the apparatus 100 comprises three or more pivot components (e.g., analogous to one or more of the pivot components 106 and 404) that pivotably support three or more circuit boards (e.g., analogous to one or more of the circuit boards 102 and 402), as will be appreciated by those skilled in the art The circuit board 402 comprises a connection component 406. The connection component 406 in one example is analogous to the connection component 302 (FIG. 3). The circuit board 102 comprises a connection component 408. The connection component 408 in one example is analogous to the connection component 110. The pivot component 404 controls a relative alignment of the connection component 406 with the connection component 408 for an engagement of the connection component 406 with the connection component 408. Upon engagement of the connection component 406 with the connection component 408, the pivot component 404 holds the circuit board 402 substantially parallel with the circuit board 102.

In one example, the pivot components 106 and 404 couple the circuit boards 102 and 402 to a same wall of the chassis 108. In another example, the pivot component 106 couples the circuit board 102 to a first wall of the chassis 108 and the pivot component 404 couples the circuit board 402 to a second wall of the chassis 108. For example, the circuit board 102 extends from the chassis 108 in a first direction and the circuit board 402 extends from the chassis 108 in a second direction. In yet another example, the pivot component 106 couples the circuit board 102 to the chassis 108 and allows rotational movement in a first direction and the pivot component 404 couples the circuit board 402 to the chassis 108 and allows rotational movement in a second direction.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
    a first pivot component coupled with a first circuit board that comprises a first connection component on a first face, wherein the first pivot component controls a relative alignment of the first connection component with a second connection component of a second circuit board for an engagement of the first connection component with the second connection component; and
    a second pivot component coupled with a third circuit board that comprises a third connection component;
    wherein the second pivot component controls a relative alignment of the third connection component with a fourth connection component on a second face of the first circuit board for an engagement of the third connection component with the fourth connection component;
    wherein the circuit board is housed within a chassis, wherein the first pivot component couples the first circuit board with the chassis.

2. The apparatus of claim 1, wherein the first pivot component guides a movement of the first circuit board about the first pivot component to selectively couple the first connection component with the second connection component.

3. The apparatus of claim 1, wherein upon the engagement, a portion of the first connection component is inserted into a portion of the second connection component;
    wherein the first pivot component controls an insertion angle of the portion of the first connection component into the portion of the second connection component.

4. The apparatus of claim 1, wherein the first connection component comprises one or more pins, wherein the second connection component comprises one or more sockets;
    wherein the first pivot component controls an insertion angle of the one or more pins into the one or more socket for the engagement.

5. The apparatus of claim 1, wherein upon a disengagement of the first connection component from the second connection component, a portion of the first connection component is extracted from a portion of the second connection component;
    wherein the first pivot component controls an extraction angle of the portion of the first connection component from the portion of the second connection component.

6. The apparatus of claim 1, wherein the first pivot component guides a movement of the first circuit board about the first pivot component to selectively decouple the first connection component from the second connection component.

7. The apparatus of claim 1, wherein upon a disengagement of the first connection component from the second connection component, the first pivot component limits a misalignment between the first connection component and the second connection component until the first connection component is free from contact with the second connection component.

8. The apparatus of claim 1, wherein the first pivot component is separated from the first connection component by a distance of the first circuit board;
    wherein the distance between the first pivot component and the first connection component limits a misalignment angle between the first connection component and the second connection component to be within a user-selected acceptable range upon the engagement.

9. The apparatus of claim 1, wherein the engagement comprises a mating length, wherein the mating length comprises a length spanned from an initial contact between the first connection component and the second connection component to a full establishment of the engagement of the first connection component and the second connection component;
    wherein the first pivot component is separated from the first connection component by a distance on the first circuit board;
    wherein the distance between the first pivot component and the first connection component is substantially equal to the mating length divided by a result of a tangent function applied to a largest misalignment angle in a user-selected acceptable range of misalignment angles between the first connection component and the second connection component upon the engagement.

10. The apparatus of claim 1, wherein upon engagement of the first connection component with the second connection component, the first pivot component holds the first circuit board substantially parallel with the second circuit board.

11. The apparatus of claim 1, wherein upon engagement of the third connection component with the fourth connection component, the second pivot component holds the third circuit board substantially parallel with the first circuit board.

12. The apparatus of claim 1, wherein the first pivot component comprises a hinge, wherein the hinge couples the first circuit board with the chassis for movement of the first circuit board relative to the second board.

13. The apparatus of claim 1, wherein the first pivot component supports the weight of the first circuit board, wherein the first pivot component holds a position of the first circuit board steady until a user adjusts the position of the first circuit board.

14. The apparatus of claim 1, wherein the first pivot component comprises a rotation restraint component, wherein the rotation restraint component slows a rotational motion of the first circuit board about the first pivot component;
    wherein upon rotational movement of the first circuit board that leads to contact between the first connection component and the second connection component, the rotation restraint component slows the rotational movement to promote a decrease in a likelihood of damage to one or more of the first connection component and the second connection component.

15. The apparatus of claim 1, wherein the first connection component and the second connection component comprise electrical connectors;

wherein after engagement of the first connection component with the second connection component, one or more electrical signals pass between the first circuit board and the second circuit board through the first connection component and the second connection component.

16. The apparatus of claim 1, wherein the first connection component and the second connection component comprises power distribution connectors;
   wherein after engagement of the first connection component with the second connection component, power is distributed between the first circuit board and the second circuit board through the first connection component and the second connection component.

17. The apparatus of claim 1, wherein the first pivot component comprises a first portion that is fixed to the first circuit board, wherein the first pivot component comprises a second portion that is fixed to the chassis;
   wherein the second pivot component comprises a first portion that is fixed to the third circuit board, wherein the second pivot component comprises a second that is fixed to the chassis.

18. The apparatus of claim 1, wherein the engagement between the first connection component and the second connection component serves to electrically and mechanically couple the first circuit board with the second circuit board;
   wherein the engagement between the third connection component and the fourth connection component serves to electrically and mechanically couple the third circuit board with the first circuit board.

19. The apparatus of claim 1, wherein the first circuit board and the second circuit board are housed within the chassis, wherein the first pivot component couples the first circuit board with a first wall of the chassis, wherein the second pivot component couples the third circuit board with a second wall of the chassis.

20. The apparatus of claim 1, wherein upon an initial contact between the first connection component and the second connection component for the engagement of the first connection component with the second connection component, the first pivot component limits a misalignment between the first connection component and the second connection component.

21. The apparatus of claim 20, wherein the misalignment comprises a misalignment angle, wherein the first pivot component keeps the misalignment angle below a threshold value.

22. The apparatus of claim 21, wherein the first pivot component keeps the misalignment angle below the threshold value to prevent damage to one or more of the first connection component and the second connection component upon the engagement.

23. The apparatus of claim 1, wherein the first pivot component couples an end portion of the first circuit board to the chassis, wherein the first pivot component guides a movement of the first circuit board about the first pivot component to promote an ease in access to the first circuit board within the chassis.

24. The apparatus of claim 23, wherein the first circuit board comprises a first major face and a second major face, wherein the first pivot component guides a movement of the first circuit board about the first pivot component to provide access to both the first major face and the second major face without detachment of the first circuit board from the chassis.

25. An apparatus, comprising:
   a pivot component coupled with a first circuit board that comprises a first connection component;
   wherein the pivot component controls a relative alignment of the first connection component with a second connection component of a second circuit board for an engagement of the first connection component with the second connection component;
   wherein the pivot component comprises a first pivot component, wherein a second pivot component is coupled with a third circuit board that comprises a third connection component;
   wherein the second pivot component controls a relative alignment of the third connection component with a fourth connection component for an engagement of the third connection component with the fourth connection component;
   wherein the first circuit board and the second circuit boards are housed within a chassis, wherein the first pivot component couples the first circuit board with a first wall of the chassis, wherein the second pivot component couples the third circuit board with a second wall of the chassis.

26. An apparatus, comprising:
   a first circuit board coupled with a first pivot component, wherein the first circuit board comprises a first connection component on a first face, wherein the first circuit board is movable about the first pivot component to selectively couple the first connection component with a second connection component of a second circuit board; and
   a third circuit board coupled with a second pivot component, wherein the third circuit board comprises a third connection component, wherein the third circuit board is movable about the second pivot component to selectively couple the third connection component with a fourth connection component on a second face of the first circuit board;
   wherein the first pivot component couples a first end portion of the first circuit board with a chassis, wherein the first connection component is substantially near a second end portion of the first circuit board, wherein the first circuit board comprises a first major face and a second major face;
   wherein the first circuit board is movable about the first pivot component to provide access to the first major face and the second major face without detachment of the first circuit board from the chassis.

27. The apparatus of claim 26, wherein the first circuit board is movable about the first pivot component to selectively decouple the first connection component from the second connection component.

28. The apparatus of claim 26, wherein the first connection component and the second connection component comprise electrical connectors;
   wherein after engagement of the first connection component with the second connection component, one or more electrical signals pass between the first circuit board and the second circuit board through the first connection component and the second connection component.

29. The apparatus of claim 26, wherein the first connection component and the second connection component comprise power distribution connectors;
   wherein after engagement of the first connection component with the second connection component, power is distributed between the first circuit board and the second circuit board through the first connection component and the second connection component.

30. The apparatus of claim 26, wherein upon engagement of the first connection component with the second connection component, the first connection component and the first pivot component hold the first circuit board substantially parallel with the second circuit board.

31. The apparatus of claim 30, wherein first connection component and the second connection component comprise parallel board-to-board connectors.

32. The apparatus of claim 26, wherein the first circuit board is movable about the first pivot component to engage the first connection component with the second connection component to electrically and mechanically couple the third circuit board with the first circuit board;

wherein the third circuit board is movable about the second pivot component to engage the third connection component with the fourth connection component to electrically and mechanically couple the third circuit board with the first circuit board.

33. The apparatus of claim 26, wherein the first circuit board and the second circuit board are housed within the chassis, wherein the first pivot component couples the first circuit board with a first wall of the chassis, wherein the second pivot component couples the third circuit board with a second wall of the chassis.

34. The apparatus of claim 26, wherein a portion of the first connection component is inserted into a portion of the second connection component to couple the first connection component with the second connection component;

wherein a movement of the first circuit board about the first pivot component controls an insertion angle of the portion of the first connection component into the portion of the second connection component.

35. The apparatus of claim 34, wherein the first connection component is separated from the first pivot component by a distance on the first circuit board;

wherein the distance between the first connection component and the first pivot component limits the insertion angle to be within a user-selected acceptable range.

36. An apparatus, comprising:
means for coupling a first circuit board to a chassis so that the first circuit board is movable about the means for coupling the first circuit board to the chassis to selectively couple a first connection component on a first face of the first circuit board with a second connection component of a second circuit board; and
means for coupling a third circuit board to the chassis so that the third circuit board is movable about the means for coupling the third circuit board to the chassis to selectively couple a third connection component of the third circuit board with a fourth connection component on a second face of the first circuit board.

37. The apparatus of claim 36, wherein the means for coupling the first circuit board to the chassis comprises means for limiting a misalignment between the first connection component and the second connection component upon an initial contact between the first connection component and the second connection component.

38. The apparatus of claim 36, wherein the means for coupling the first circuit board to the chassis comprises means for limiting a misalignment angle between the first connection component and the second connection component to be within a user-selected acceptable range upon an initial contact between the first connection component and the second connection component.

39. The apparatus of claim 36, wherein the first circuit board is movable about the means for coupling the first circuit board to the chassis to engage the first connection component with the second connection component to electrically and mechanically couple the third circuit board with the first circuit board;

wherein the third circuit board is movable about the means for coupling the third circuit board to the chassis to engage the third connection component with the fourth connection component to electrically and mechanically couple the third circuit board with the first circuit board.

40. The apparatus of claim 36, wherein the first circuit board and the second circuit board are housed within the chassis, wherein the means for coupling the first circuit board to the chassis comprises means for coupling the first circuit board with a first wall of the chassis, wherein the means for coupling the third circuit board to the chassis comprises means for coupling the third circuit board with a second wall of the chassis.

41. A method, comprising the steps of:
coupling a first circuit board with a first pivot component to control a relative alignment of a first connection component on a first face of the first circuit board with a second connection component of a second circuit board for an engagement of the first connection component with the second connection component;

employing a user-selected acceptable range of a misalignment angle of an engagement between a third connection component of a third circuit board and a fourth connection component on a second face of the first circuit board to determine a location relative to the third connection component; and coupling the third circuit board with a second pivot component at the location to limit the misalignment angle to be within the user-selected acceptable range upon the engagement between the third connection component and the fourth connection component;

wherein the first circuit board and the second circuit board are housed within a chassis, wherein the step of coupling the first circuit board with the first pivot component to control the relative alignment of the first connection component on the first face of the first circuit board with the second connection component of the second circuit board for the engagement of the first connection component with the second connection component comprises the step of:

coupling the first pivot component and the first circuit board with a first wall of the chassis;

wherein the step of coupling the third circuit board with the second pivot component at the location to limit the misalignment angle to be within the user-selected acceptable range upon the engagement between the third connection component and the fourth connection component comprises the step of:

coupling the second pivot component and the third circuit board with a second wall of the chassis.

42. The method of claim 41, wherein the engagement between the third connection component and the fourth connection component comprises a mating length, wherein the mating length comprises a length spanned from an initial contact between the third connection component and the fourth connection component to a full establishment of the engagement of the third connection component with the fourth connection component;

wherein the step of employing the user-selected acceptable range of the misalignment angle of the engagement between the third connection component of the third circuit board and the fourth connection component on the second face of the first circuit board to determine the location relative to the third connection component comprises the step of:

determining the location relative to the third connection component to be a distance from the third connection component on the third circuit board based on the user-selected acceptable range of the misalignment angle and the mating length.

43. The method of claim 42, wherein the step of coupling the third circuit board with the second pivot component at the location to limit the misalignment angle to be within the user-selected acceptable range upon the engagement between the third connection component and the fourth connection component comprises the step of:

coupling the third circuit board with the second pivot component at the distance from the third connection component to allow movement of the third circuit board about the second pivot component for the engagement of the third connection component with the fourth connection component that is within the user-selected acceptable range of the misalignment angle.

44. The method of claim 41, wherein the step of coupling the third circuit board with the second pivot component at the location to limit the misalignment angle to be within the user-selected acceptable range upon the engagement between the third connection component and the fourth connection component comprises the step of:

coupling the second pivot component with the chassis to allow the second pivot component to hold the third circuit board substantially parallel with the first circuit board.

45. The method of claim 41, wherein the step of coupling the first circuit board with the first pivot component to control the relative alignment of the first connection component on the first face of the first circuit board with the second connection component of the second circuit board for the engagement of the first connection component with the second connection component comprises the step of:

electrically and mechanically coupling the first circuit board with the second circuit board through the engagement between the first connection component and the second connection component;

wherein the step of coupling the third circuit board with the second pivot component at the location to limit the misalignment angle to be within the user-selected acceptable range upon the engagement between the third connection and the fourth connection component comprises the step of:

electrically and mechanically coupling the third circuit board with the first circuit board through the engagement between the third connection component and the fourth connection component.

* * * * *